(12) United States Patent
Komamura

(10) Patent No.: US 7,224,728 B2
(45) Date of Patent: May 29, 2007

(54) PULSE WIDTH MODULATOR AND PULSE WIDTH MODULATION METHOD

(75) Inventor: Mitsuya Komamura, Saitamaken (JP)

(73) Assignee: Pioneer Corporation, Tokyo (JP)

( * ) Notice: Subject to any disclaimer, the term of this patent is extended or adjusted under 35 U.S.C. 154(b) by 729 days.

(21) Appl. No.: 10/464,485

(22) Filed: Jun. 19, 2003

(65) Prior Publication Data
US 2004/0213343 A1    Oct. 28, 2004

(30) Foreign Application Priority Data
Jun. 27, 2002    (JP) .............................. 2002-188319

(51) Int. Cl.
*H03K 7/08* (2006.01)
(52) U.S. Cl. .................... 375/238; 375/239; 341/143
(58) Field of Classification Search ............... 375/234, 375/238, 239–243, 254; 341/56, 57, 143, 341/144
See application file for complete search history.

(56) References Cited

U.S. PATENT DOCUMENTS 6,473,457 B1 * 10/2002 Pascual et al. .............. 375/238
6,549,085 B1 *  4/2003 Wagh et al. ................. 332/109
6,606,044 B2 *  8/2003 Roeckner et al. ........... 341/143

FOREIGN PATENT DOCUMENTS

EP    1 050 971 A2    11/2000

OTHER PUBLICATIONS

"Prediction Correction Algorithm For Natural Pulse Width Modulation", Pallab Midya et al., Motorola Labs, pp. 1-24.
"Power Digital To Analogue Width Modulation And Digital Signal Processing", R. E. Hiorns et al., IEE Proceedings-G, Circuits, Devices and Systems, (Oct. 1993) No. 5, pp. 329-338.
"Reduction Of Spectral Distortion In Class D Amplifiers By An Enhanced Pulse Width Modulation Sampling Process", P.H. Mellor et al., IEE Proceedings-G, (Aug. 1991), No. 4, pp. 441-449.

* cited by examiner

Primary Examiner—Dac V. Ha
(74) Attorney, Agent, or Firm—Arent Fox LLP

(57) ABSTRACT

A pulse width modulator for producing a PWM signal having reduced nonlinear distortion through interpolation processing with fewer computation steps is provided. The computational processing, $W=\{1+\alpha(X_2-X_1)\}\{0.25\ (X_1+X_2)\}+0.5$, is performed in accordance with successive sample values $(X_1, X_2)$ in a PCM data train to determine a weighting factor (W). The computational processing, $Xq=0.5 \cdot X_0(W^2-W)+X_1(1-W^2)+0.5 \cdot X_2(W^2+W)$, is performed using the sample values $(X_1, X_2)$, a sample value $(X_0)$ previous to the sample value $(X_1)$, and the weighting factor (W) to thereby determine an interpolated sample value (Xq) having an amplitude close to that of an original analog signal (X(t)) generating the PCM data train. A point in time (tq) at which a reference signal (R(t)) takes on the interpolated sample value (Xq) is then determined to produce a PWM signal (Spwm) which is logically inverted at the point in time (tq).

10 Claims, 8 Drawing Sheets

PULSE WIDTH MODULATOR AND PULSE WIDTH MODULATION METHOD

BACKGROUND OF THE INVENTION

The present invention relates to a pulse width modulator and a pulse width modulation method.

The present application claims priority from Japanese Application No.2002-188319, the disclosure of which is incorporated herein by reference.

In the field involving digital signal processing such as the audio video technology, the communication technology, and the computer technology, PCM (pulse code modulated) data trains may be converted into PWM (pulse width modulation) signals for processing.

For example, a digital amplifier is conventionally known which performs a PCM to PWM conversion on a PCM data train, such as speech or music, reproduced such as with a CD (Compact Disc) player or a DVD (Digital Versatile Disc) player, to derive a PWM signal, which is in turn used to control a current supplied to a loudspeaker or the like, thereby providing a sound corresponding to the PWM signal.

In general, such a method as shown in FIG. 7A is employed to perform the PCM to PWM conversion.

First, a PCM data train Xn shown in a step-wise shape in FIG. 7A is generated by sampling an analog sound signal shown by a dotted line at a predetermined sampling frequency fs.

Upon the PCM to PWM conversion of such a PCM data train Xn, a comparison operation is performed between the PCM data train Xn and a sawtooth wave reference signal R(t) synchronous with the aforementioned sampling frequency fs.

Then, a square wave signal Su, as shown in FIG. 7C, is produced which is inverted to the logic "H" at start points in time (see $t_3$ and $t_6$) in a sampling period (1/fs) and inverted to the logic "L" at points in time (see $t_1$ and $t_5$) at which the slope portion of the reference signal R(t) intersects the PCM data train Xn. This signal Su is defined as a PWM signal.

The method for converting the PCM data train Xn into the PWM signal is referred to as the UPWM (Uniform Sampling PWM) modulation.

In some cases, since the PCM data train Xn shown in FIG. 7A is discrete, the point in time at which a sample value thereof intersects the reference signal R(t) may differ from the point in time at which the original analog signal x(t) intersects the reference signal R(t).

For this reason, when compared with a PWM signal generated directly from an analog signal by the NPWM (Natural Sampling PWM) modulation, the PWM signal Su obtained by the aforementioned UPWM modulation may contain nonlinear distortion, thereby raising a problem of causing distortion in reproduced sound, for example, upon allowing the aforementioned loudspeaker or the like to sound.

That is, as shown in FIG. 7B, the NPWM modulation compares the original analog signal X(t) with the aforementioned reference signal R(t) and then generates, as shown by the signal $S_N$ in FIG. 7C, a square wave PWM signal $S_N$ which is inverted to the logic "H" at start points in time (see $t_3$ and $t_6$) in the sampling period (1/fs) and inverted to the logic "L" at points in time (see $t_2$ and $t_4$) at which the slope portion of the reference signal R(t) intersects the analog signal X(t).

Accordingly, as can be seen from FIG. 7C, even for the same original analog signal X(t), the PWM signal Su provided by the UPWM modulation and the PWM signal $S_N$ provided by the NPWM modulation are in the logic "H" or the logic "L" for different lengths of time in each sampling period (1/fs), thereby causing a problem of making it difficult to provide a high quality reproduction of sound when the aforementioned loudspeaker or the like is allowed to sound in accordance with the PWM signal Su.

In this context, interpolation processing is performed to generate a PWM signal having reduced nonlinear distortion.

FIG. 8 is a view showing a conventionally practiced interpolation method, shown in contrast to FIG. 7A. This interpolation method is referred to as the LPWM (linearized PWM) modulation.

Referring to FIG. 8, the period To from a point in time ta to tb equals each sampling period (1/fs) and is normalized to be unity. Each amplitude of the PCM data train Xn and the reference signal R(t) is also normalized within the range of ±1.

In each sampling period To with the start point in time ta being a reference time (t=0), a point in time tp at which a straight line S(t) connecting between sample values $X_1$ and $X_2$ of the PCM data train Xn at the start point in time ta and the end point in time tb intersects the reference signal R(t) is determined to produce the PWM signal Su.

That is, the straight line S(t) in each sampling period To is expressed by the following equation (1) and the reference signal R(t) is expressed by the following equation (2):

$$S(t)=(X_2-X_1)t+X_1 \qquad (1)$$

$$R(t)=2t-1 \qquad (2)$$

The point in time tp at which the straight line S(t) intersects the reference signal R(t) and the amplitude value Xp at the point in time tp are determined by the following equations (3) and (4):

$$tp=(X_1+1)/(2-X_2+X_1) \qquad (3)$$

$$Xp=(X_1+X_2)/(2-X_2+X_1) \qquad (4)$$

The aforementioned equations (1) to (4) are expressed with the point in time ta defined as the origin of the sampling period To (i.e., t=0) and the point in time tb defined as t=1.

A square wave signal which is inverted to the logic "H" at the start point in time ta in the sampling period To, inverted to the logic "L" at the point in time tp, and inverted again to the logic "H" at the end point in time tb is defined as an interpolated PWM signal Su.

According to this interpolation processing, since the point in time tp is close to a point in time $t_2$ of the PWM signal $S_N$ shown in FIG. 7C, it is possible for the PWM signal Su to approach the PWM signal $S_N$.

However, as shown by the aforementioned equations (3) and (4), the prior art interpolation method required a division operation to determine the coordinates (tp, Xp) at the point in time tp at which the logic state of the PWM signal Su is inverted, thus raising a problem of requiring many computation steps.

In particular, when the PWM signal Su is produced while the aforementioned interpolation processing is performed on a PCM data train sampled at a higher sampling frequency or on a PCM data train to be generated from data containing many bits (many levels of quantization), the aforementioned division operation resulted in many computation steps and thereby required a long time for the PCM to PWM conversion, thus raising a problem of making it difficult to perform signal processing at high speeds.

SUMMARY OF THE INVENTION

The present invention was accomplished in view of the problems existing in the above-described prior art. It is therefore an object of the present invention to provide a pulse width modulation signal generation method and apparatus for performing interpolation processing in fewer computation steps.

A pulse width modulator according to a first aspect of the present invention converts a pulse code modulated data train to produce a pulse width modulation signal. The pulse width modulator is characterized by comprising: first unit for calculating, from a first sample value and a second sample value adjacent to each other in the pulse code modulated data train, a weighting factor taking on a larger value as the first sample value and the second sample value take on larger positive values; second unit for interpolating the first sample value and the second sample value with the weighting factor to determine a linearly interpolated value; and third unit for producing a pulse width modulation signal in accordance with said linearly interpolated value.

A pulse width modulator according to a second aspect of the invention is characterized in the pulse width modulator set forth in the first aspect in that the first unit determines the weighting factor W through the computational processing in accordance with the first sample value $X_1$, the second sample value $X_2$, and an appropriate coefficient α, i.e., $W=\{1+\alpha(X_2-X_1)\}\{0.25(X_1+X_2)\}+0.5$.

A pulse width modulator according to a third aspect of the invention is characterized in the pulse width modulator set forth in the first aspect in that the second unit determines the linearly interpolated value Xp through the computational processing in accordance with the first sample value $X_1$, the second sample value $X_2$, and the weighting factor W, i.e., $Xp=(1-W)X_1+W*X_2$.

A pulse width modulator according to a fourth aspect of the invention converts a pulse code modulated data train to produce a pulse width modulation signal. The pulse width modulator is characterized by comprising: first unit for calculating, from a first sample value and a second sample value adjacent to each other in the pulse code modulated data train, a weighting factor W taking on a larger value as the first sample value and the second sample value take on larger positive values; second unit for interpolating the first sample value and the second sample value with the weighting factor to determine a linearly interpolated value; third unit for determining a difference between the first sample value and an arithmetic average value of a sample value provided one sampling period before the first sample value and the second sample value; fourth unit for determining an interpolated sample value in accordance with the linearly interpolated value, the first sample value, the second sample value, and the difference; and fifth unit for producing a pulse width modulation signal in accordance with the interpolated sample value.

A pulse width modulator according to a fifth aspect of the invention is characterized in the pulse width modulator set forth in the fourth aspect in that the third unit determines the difference d through the computational processing in accordance with the first sample value $X_1$, the second sample value $X_2$, and a sample value $X_0$ provided one sampling period before the first sample value $X_1$, i.e., $d=X_1-0.5(X_0+X_2)$.

A pulse width modulator according to a sixth aspect of the invention is characterized in the pulse width modulator set forth in the fourth aspect in that the fourth unit determines the interpolated sample value Xq through the computational processing in accordance with the first sample value $X_1$, the second sample value $X_2$, the difference d, the linearly interpolated value Xp, and an appropriate coefficient β, i.e., $Xq=Xp+\beta \cdot d(X_1-Xp)(Xp-X_2)$ A pulse width modulator according to a seventh aspect of the invention converts a pulse code modulated data train to produce a pulse width modulation signal. The pulse width modulator is characterized by comprising: first unit for calculating, from a first sample value $X_1$ and a second sample value $X_2$ adjacent to each other in the pulse code modulated data train, a weighting factor W taking on a larger value as the first sample value $X_1$ and the second sample value $X_2$ take on larger positive values; second unit for determining an interpolated sample value Xq through the computational processing in accordance with a sample value $X_0$ provided one sampling period before the first sample value $X_1$, the first sample value $X_1$, the second sample value $X_2$, and the weighting factor W, i.e., $Xq=0.5 \cdot X_0(W^2-W)+X_1(1-W^2)+0.5 \cdot X_2(W^2+W)$; and third unit for producing a pulse width modulation signal in accordance with the interpolated sample value Xq.

A pulse width modulator according to an eighth aspect of the invention converts a pulse code modulated data train oversampled at a sampling frequency twice as high as a predetermined sampling frequency to produce a pulse width modulation signal. The pulse width modulator is characterized by comprising first unit for determining, if a sample value $X_2$ inserted into the pulse code modulated data train by the oversampling is negative, a first weighting factor $W_N$ through the computational processing in accordance with the sample value $X_2$, a sample value $X_1$ previously adjacent to the sample value $X_2$, and an appropriate coefficient γ, i.e., $W_N=\{1+\gamma(X_2-X_1)\}\{0.5(X_1+X_2)+0.5\}+0.5$, as well as a first interpolated sample value XN through the computational processing in accordance with the first weighting factor $W_N$, the sample value $X_2$, and the previously adjacent sample value $X_1$, i.e., $X_N=(1-W_N)X_1+W_NX_2$, the first unit for further determining, if the sample value $X_2$ inserted into the pulse code modulated data train by the oversampling is positive, a second weighting factor Wp through the computational processing in accordance with the sample value $X_2$, a sample value $X_3$ subsequently adjacent to the sample value $X_2$, and an appropriate coefficient γ, i.e., $Wp=\{1+\gamma(X_3-X_2)\}\{0.5(X_2+X_3)-0.5\}+0.5$, as well as a second interpolated sample value Xp through the computational processing in accordance with the second weighting factor Wp, the sample value $X_2$, and the subsequently adjacent sample value $X_3$, i.e., $Xp=(1-Wp)X_2+WPX_3$; and second unit for producing a pulse width modulation signal in accordance with the first sample value XN if the inserted sample value $X_2$ is negative and in accordance with the second sample value Xp if the inserted sample value $X_2$ is positive.

A pulse width modulation method according to a ninth aspect of the invention converts a pulse code modulated data train to produce a pulse width modulation signal. The pulse width modulation method is characterized by comprising: a first step of calculating, from a first sample value and a second sample value adjacent to each other in the pulse code modulated data train, a weighting factor taking on a larger value as the first sample value and the second sample value take on larger positive values; a second step of interpolating the first sample value and the second sample value with the weighting factor to determine a linearly interpolated value; and a third step of producing a pulse width modulation signal in accordance with the linearly interpolated value.

A pulse width modulation method according to a tenth aspect of the invention converts a pulse code modulated data train to produce a pulse width modulation signal. The pulse width modulation method is characterized by comprising: a first step of calculating, from a first sample value and a second sample value adjacent to each other in the pulse code modulated data train, a weighting factor taking on a larger value as the first sample value and the second sample value take on larger positive values; a second step of interpolating the first sample value and the second sample value with the weighting factor to determine a linearly interpolated value; a third step of determining a difference between the first sample value and an arithmetic average value of a sample value provided one sampling period before the first sample value and the second sample value; a fourth step of determining an interpolated sample value in accordance with the linearly interpolated value, the first sample value, the second sample value, and the difference; and a fifth step of producing a pulse width modulation signal in accordance with the interpolated sample value.

A pulse width modulation method according to an eleventh aspect of the invention converts a pulse code modulated data train to produce a pulse width modulation signal. The pulse width modulation method is characterized by comprising: a first step of calculating, from a first sample value $X_1$ and a second sample value $X_2$ adjacent to each other in the pulse code modulated data train, a weighting factor W taking on a larger value as the first sample value $X_1$ and the second sample value $X_2$ take on large positive values; a second step of determining an interpolated sample value Xq through the computational processing in accordance with a sample value $X_0$ provided one sampling period before the first sample value $X_1$, the first sample value $X_1$, the second sample value $X_2$, and the weighting factor W, i.e., $Xq=0.5 \cdot X_0(W^2-W)+X_1(1-W^2)+0.5 \cdot X_2(W^2+W)$; and a third step of producing a pulse width modulation signal in accordance with the interpolated sample value Xq.

A pulse width modulation method according to a twelfth aspect of the invention converts a pulse code modulated data train oversample data sampling frequency twice as high as a predetermined sampling frequency to produce a pulse width modulation signal. The pulse width modulation method is characterized by comprising: a first step including the substeps of determining, if a sample value $X_2$ inserted into the pulse code modulated data train by the oversampling is negative, a first weighting factor $W_N$ through the computational processing in accordance with the sample value $X_2$, a sample value $X_1$ previously adjacent to the sample value $X_2$, and an appropriate coefficient γ, i.e., $W_N=\{1+\gamma(X_2-X_1)\}\{0.5(X_1+X_2)+0.5\}+0.5$, as well as a first interpolated sample value $X_N$ through the computational processing in accordance with the first weighting factor $W_N$, the sample value $X_2$, and the previously adjacent sample value $X_1$, i.e., $X_N=(1-W_N)X_1+W_N X_2$, the first step further including the substeps of determining, if the sample value $X_2$ inserted into the pulse code modulated data train by the oversampling is positive, a second weighting factor Wp through the computational processing in accordance with the sample value $X_2$, a sample value $X_3$ subsequently adjacent to the sample value $X_2$, and an appropriate coefficient γ, i.e., $Wp=\{1+\gamma(X_3-X_2)\}\{0.5(X_2+X_3)-0.5\}+0.5$, as well as a second interpolated sample value Xp through the computational processing in accordance with the second weighting factor Wp, the sample value $X_2$, and the subsequently adjacent sample value $X_3$, i.e., $Xp=(1-Wp)X_2+Wp X_3$; and a second step of producing a pulse width modulation signal in accordance with the first sample value $X_N$ if the inserted sample value $X_2$ is negative and in accordance with the second sample value Xp if the inserted sample value $X_2$ is positive.

The pulse width modulator and the pulse width modulation method perform interpolation processing in accordance with a pulse code modulated data train, thereby producing a PWM signal which is close to a PWM signal generated through the NPWM (Natural Sampling PWM) modulation and can reduce nonlinear distortion.

Furthermore, the pulse width modulator and the pulse width modulation method employ fewer computation steps to perform the interpolation processing without a division operation, thereby producing a PWM signal which can reduce nonlinear distortion.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Now, the present invention will be explained below in more detail with reference to the accompanying drawings in accordance with the preferred embodiments.

First Embodiment

A first embodiment of the present invention will be described with reference to FIGS. 1 to 4B.

Figure 1:
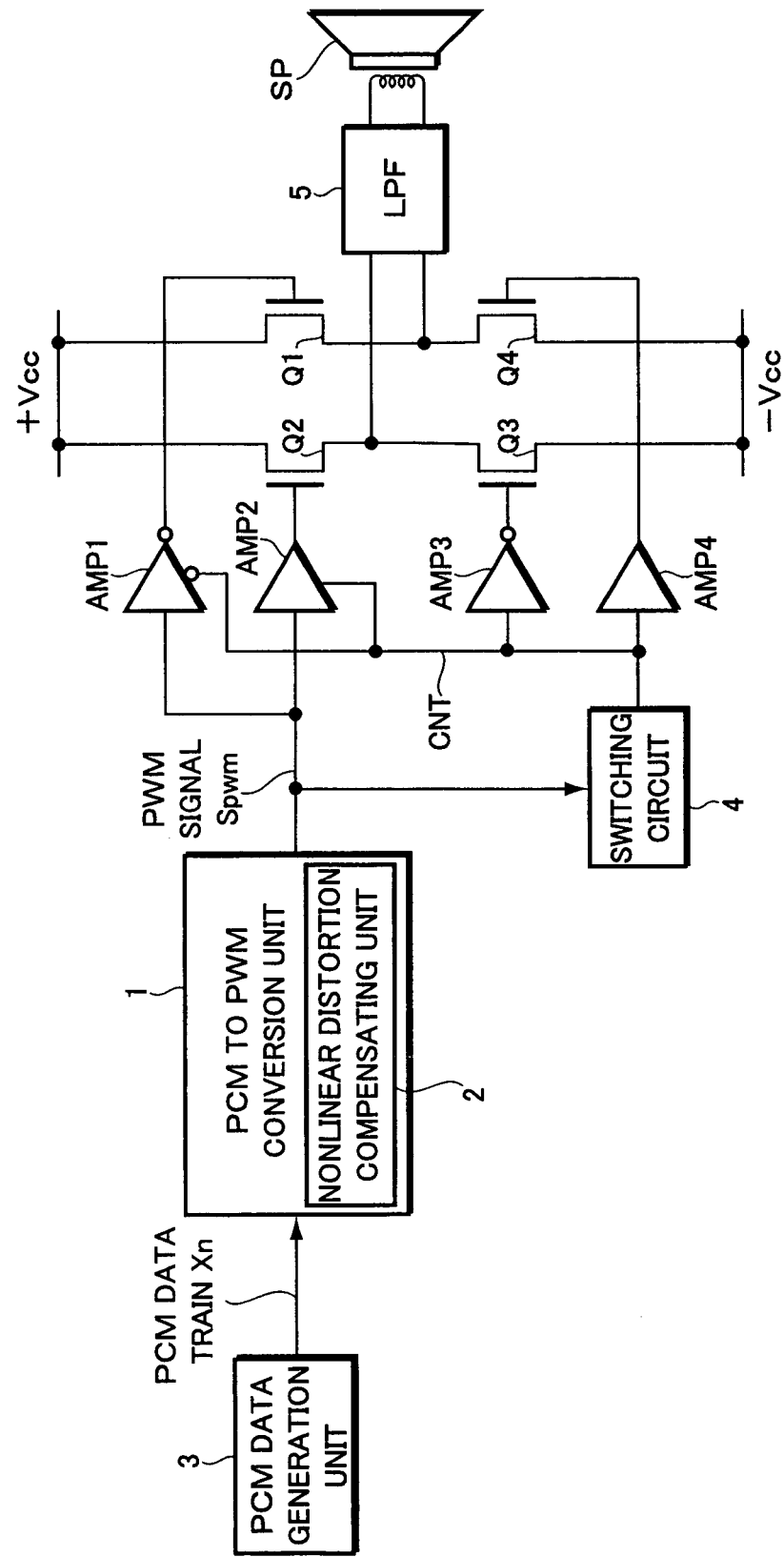
FIG. 1 is a block diagram showing the configuration of a pulse width modulator according to a first embodiment of the invention.
Figure 2:
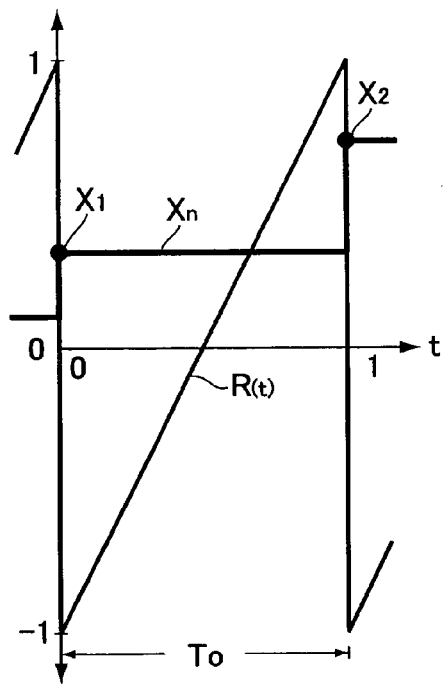
FIGS. 2A to 2D are explanatory views showing the interpolation processing and the operation of generating an interpolation signal by the pulse width modulator shown in FIG. 1.
Figure 2:
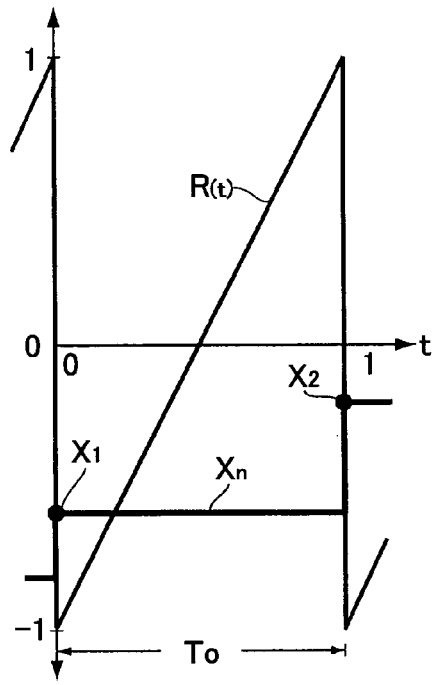
Figure 2:
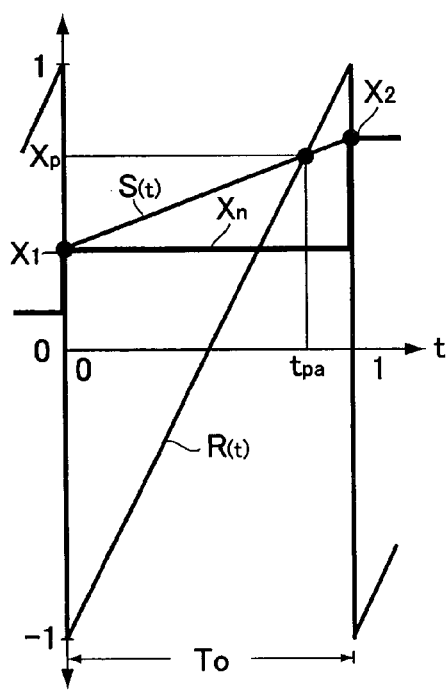
Figure 2:
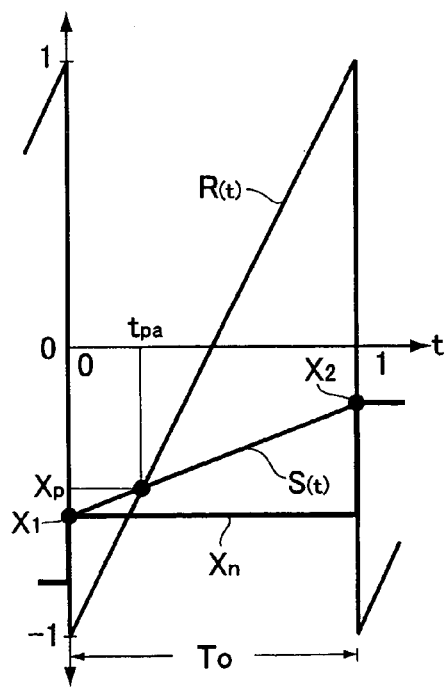
Figure 3:
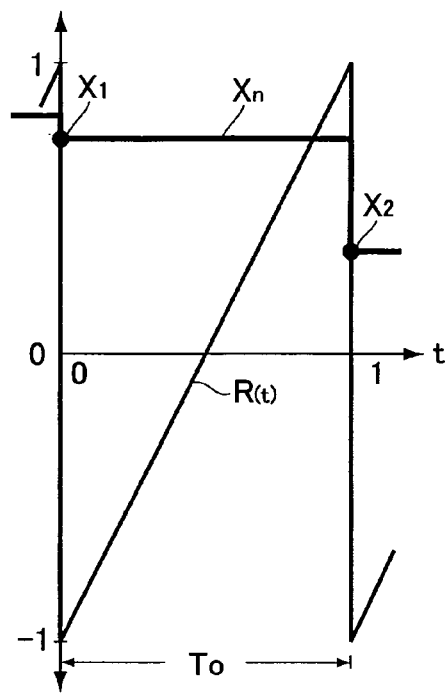
FIGS. 3A to 3D are further explanatory views showing the interpolation processing and the operation of generating an interpolation signal by the pulse width modulator shown in FIG. 1.
Figure 3:
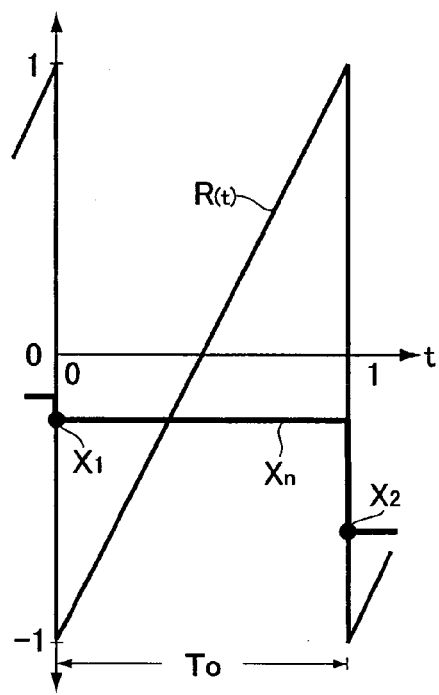
Figure 3:
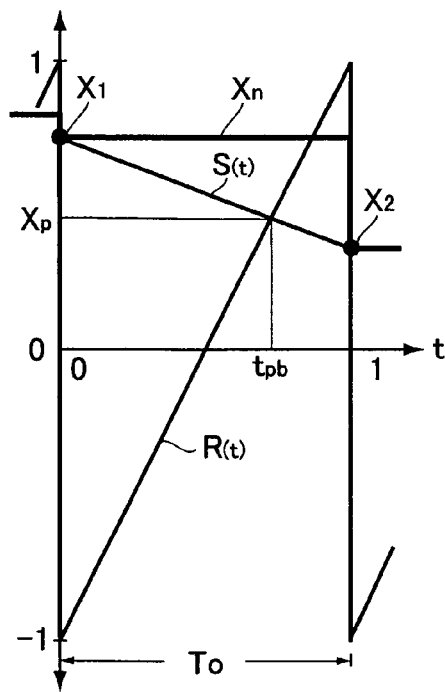
Figure 3:
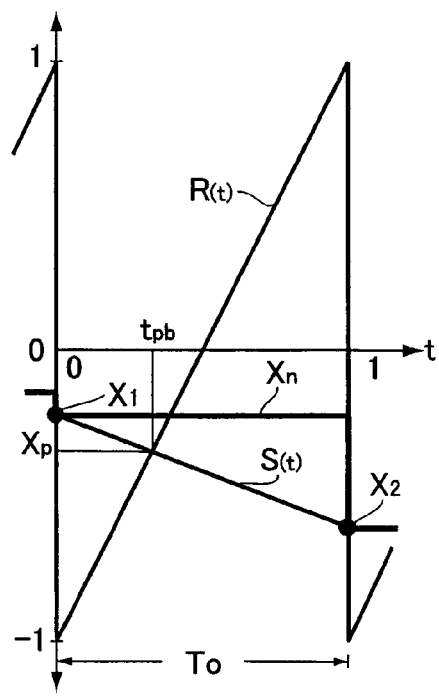

FIG. 1 is a view showing the configurations of a pulse width modulator according to this embodiment and an exemplary digital amplifier utilizing the pulse width modulator.

FIGS. 2A to 4B are views showing the principle of the interpolation processing performed by the pulse width modulator according to this embodiment upon producing a pulse width modulation (PWM) signal.

First, referring to FIG. 1, explained are the configurations of a pulse width modulator 1 according to this embodiment and an exemplary digital amplifier utilizing the pulse width modulator 1.

The pulse width modulator 1 includes a PCM to PWM conversion unit in which a PCM data train Xn varying within the range of a positive value and a negative value generated in accordance with a given sampling frequency fs is supplied to allow a sawtooth wave reference signal R(t) varying within the range of a positive value and a negative value in sync with the sampling frequency fs to be compared with the PCM data train Xn, and a square wave PWM signal Spwm taking on the logic "H" or "L" in accordance with the result of the comparison operation is produced for output.

The PCM to PWM conversion unit includes a nonlinear compensating unit 2 for performing interpolation processing to produce the PWM signal Spwm having reduced nonlinear distortion.

The pulse width modulator 1 is formed such as of a digital signal processor (DSP) having a computational function, a microprocessor (MPU), or a semiconductor integrated circuit device (LSI), and the computational processing such as by the digital signal processor is adapted to perform interpolation processing and generate the PWM signal Spwm.

By way of example, the pulse width modulator 1 configured as such is applied to a digital amplifier as shown in FIG. 1.

For example, the digital amplifier is supplied with a PCM data train Xn from a PCM data generation unit 3 which acquires through an interface PCM data such as data received via an information reproduction apparatus such as a CD player or DVD player, a personal computer (PC), or a communication network such as the Internet, and then converts the PCM data to PCM data oversampled at a predetermined sampling frequency.

The pulse width modulator 1 converts the PCM data train Xn to a PWM signal Spwm, thereby allowing a loudspeaker SP to sound in accordance with the PWM signal Spwm.

That is, the digital amplifier according to this example includes transistors Q1, Q2, Q3, and Q4, which are connected between a predetermined positive voltage source (+Vcc) and a negative voltage source (−Vcc), inverting amplifiers AMP1, AMP3, non-inverting amplifiers AMP2, AMP4, a switching circuit 4, and a low pass filter 5.

The switching circuit 4 detects one by one the periods during which the PWM signal Spwm is at the logic "H" and at the logic "L," and outputs a binary control signal CNT which is set to the logic "H" for the logic "H" level of the PWM signal Spwm and to the logic "L" for the logic "L" level thereof.

The inverting amplifier AMP1 is brought into a conducting (ON) state with the control signal CNT at the logic "L" and into a non-conducting (OFF) state at the logic "H," and inverts and power amplifies the PWM signal Spwm only in the conducting (ON) state to supply the resulting signal to the transistor Q1.

The non-inverting amplifier AMP2 is brought into a conducting (ON) state with the control signal CNT at the logic "H" and a non-conducting (OFF) state at the logic "L," and power amplifies the PWM signal Spwm only in the conducting (ON) state to supply the resulting signal to the transistor Q2.

The inverting amplifier AMP3 inverts and power amplifies the control signal CNT to supply the resulting signal to the transistor Q3, thereby turning ON or OFF the transistor Q3.

The non-inverting amplifier AMP4 power amplifies the control signal CNT to supply the resulting signal to the transistor Q4, thereby turning ON or OFF the transistor Q4.

For example, the low pass filter 5, having an audio frequency range as its passband, receives a signal current supplied from the connection of the transistors Q1 and Q4 and the connection of the transistors Q2 and Q3 to eliminate other unnecessary high frequency components above the audio frequency range and then supply the resulting signal to the loudspeaker SP.

According to the digital amplifier configured as described above, when the inverting amplifier AMP1 is turned ON in accordance with the control signal CNT, the PWM signal Spwm is inverted and then supplied to the transistor Q1, while the transistor Q3 is turned ON and the transistors Q2 and Q4 are turned OFF.

This causes a signal current corresponding to the PWM signal Spwm to flow through the transistors Q1 and Q3 to the low pass filter 5, and flow from the low pass filter 5 to the loudspeaker SP.

Furthermore, when the non-inverting amplifier AMP2 is turned ON in accordance with the control signal CNT, the PWM signal is supplied to the transistor Q2, while the transistor Q4 is turned ON and the transistors Q1 and Q3 are turned OFF.

This causes a signal current corresponding to the PWM signal Spwm to flow through the transistors Q2 and Q4 to the low pass filter 5, and flow from the low pass filter 5 to the loudspeaker Sp.

As described above, the digital amplifier according to this embodiment controls the ON/OFF operations of the transistors Q1 to Q4 in accordance with the PWM signal Spwm outputted from the pulse width modulator 1 to thereby switch the directions of the signal current flowing into the loudspeaker SP in response to the logic "H" and "L" of the PWM signal Spwm. This allows the loudspeaker SP to provide sound corresponding to the PWM signal Spwm.

Now, the principle of interpolation performed by the pulse width modulator 1 applied to such a digital amplifier or the like and the principle of the PWM modulation will be described below with reference to FIGS. 2A to 4B.

First, in brief, when a PCM data train Xn varying within the range of a positive value and a negative value with respect to a predetermined bias value 0 is entered, the pulse width modulator 1 functions to produce the PWM signal Spwm from the PCM data train Xn.

Furthermore, when the aforementioned PCM data train Xn generated at a given sampling frequency fs is supplied, the pulse width modulator 1 compares a sawtooth wave reference signal R(t) synchronous with the sampling frequency fs with the PCM data train Xn to produce the PWM signal Spwm in accordance with the result of the comparison operation.

Furthermore, the value of the PCM data train Xn and the amplitude of the reference signal R(t) are normalized within the range of ±1 for processing.

Still furthermore, each sampling period To is defined as a unit time width, with the start points in time of any three successive sampling periods To at t=−1, t=0, and t=1, respectively, for the interpolation processing (to be discussed later).

The PWM signal Spwm is produced while the interpolation processing is being performed in any one of two modes where the PCM data train Xn is positive in a sampling period To and where the PCM data train Xn is negative during the same sampling period.

In addition to the aforementioned two modes, other two modes (four modes in total) may occur in which the sample value of the PCM data train Xn at the start point in time of a sampling period To is less than the sample value at the start point in time of the subsequent sampling period To and the sample value of the PCM data train Xn at the start point in time of a sampling period To is greater than the sample value at the start point in time of the subsequent sampling period To.

For this reason, in consideration of these four modes in total, the PWM signal Spwm is produced by the interpolation processing.

More specifically, the PCM data train Xn may be positive in a sampling period To in the cases as shown in FIGS. 2A and 3A.

That is, FIG. 2A shows a case where the PCM data train Xn is positive with the sample value $X_1$ at the start point in time of a sampling period To being less than the sample value $X_2$ at the start point in time of the subsequent sampling period To.

FIG. 3A shows a case where the PCM data train Xn is positive with the sample value $X_1$ at the start point in time of a sampling period To being larger than the sample value $X_2$ at the start point in time of the subsequent sampling period To.

On the other hand, the PCM data train Xn may be negative in a sampling period To in the cases as shown in FIGS. 2B and 3B.

That is, FIG. 2B shows a case where the PCM data train Xn is negative, with the sample value $X_1$ at the start point in time of a sampling period To being less than the sample value $X_2$ at the start point in time of the subsequent sampling period To.

FIG. 3B shows a case where the PCM data train Xn is negative, with the sample value $X_1$ at the start point in time of a sampling period To being larger than the sample value $X_2$ at the start point in time of the subsequent sampling period To.

As described above, the PCM data train Xn may experience the four modes in total as shown in FIGS. 2A, 2B, 3A, and 3B. Accordingly, for any of these modes, the pulse width modulator according to the invention generates the PWM signal Spwm while performing appropriate interpolation processing.

Although it will be detailed later, the interpolation processing shown in FIG. 2C is performed when the PCM data train Xn is in the mode shown in FIG. 2A; the interpolation processing shown in FIG. 2D is performed when in the mode shown in FIG. 2B; the interpolation processing shown in FIG. 3C is performed when in the mode shown in FIG. 3A; and the interpolation processing shown in FIG. 3D is performed when in the mode shown in FIG. 3B. Then, the interpolation processing shown in FIGS. 4A to 4B is performed using the results obtained through the interpolation processing mentioned above, thereby generating the final interpolated PWM signal Spwm.

Now, the interpolation principle of the pulse width modulator 1 and the principle of the PWM modulation are described in detail with reference to FIGS. 2C, 2D, 3C, 3D, and FIGS. 4A to 4B.

First, in conclusion, when a PCM data train Xn having any one of the aforementioned modes is entered, the interpolation processing shown in one of FIGS. 2C, 2D, 3C, and 3D is performed in response to that mode. More specifically, the sample value $X_1$ of the PCM data train Xn at the start point in time of a sampling period To and the sample value $X_2$ of the PCM data train Xn at the start point in time of the subsequent sampling period To are acquired and then the computational processing expressed by the following equation (5) is performed using these sample value $X_1$ and $X_2$, thereby determining a weighting factor W.

$$W=\{1+\alpha(X_2-X_1)\}\{0.25(X_1+X_2)\}+0.5 \quad (5)$$

Additionally, the weighting factor W is applied to the computational equation expressed by the following equation (6), thereby determining the linearly interpolated value Xp of the sample values to approximate the analog signal.

$$Xp=(1-W)X_1+W \cdot X_2 \quad (6)$$

The coefficient $\alpha$ in the aforementioned equation (5) is provided to make fine adjustments of the weighting factor W and can be set at a value on the order of 0.5 to perform the PWM modulation using the linearly interpolated value Xp, thereby producing a PWM signal Spwm close to the PWM signal obtained through the NPWM modulation.

Then, the interpolation processing is further performed to produce a PWM signal close to the PWM signal obtained through the NPWM modulation.

First, three successive sample values $X_0$, $X_1$, and $X_2$, i.e., the aforementioned sample values $X_1$ and $X_2$ and the sample value $X_0$ of the PCM data train Xn at the start point in time of the preceding sampling period To, are applied to the following equation (7), thereby calculating a correction factor d.

$$d=X_1-0.5(X_0+X_2) \quad (7)$$

The correction factor d is further applied to the following equation (8) to determine an interpolated sample value Xq. The sample value Xq is then assumed to approximate the coordinates (tc, Xc) at which the aforementioned analog signal X(t) intersects the reference signal R(t) upon performing the NPWM modulation.

$$Xq=Xp+\beta \cdot d(X_1-Xp)(Xp-X_2) \quad (8)$$

The point in time tq corresponding to the sample value Xq is then determined at which the reference signal R(t) equals the interpolated sample value Xq, and the PWM signal Spwm is produced and outputted which is logically inverted at the point in time tq.

That is, the PWM signal Spwm is inverted to the logic "H" at the start point in time of the sampling period To and then inverted to the logic "L" at the aforementioned point in time tq, thereby producing and outputting the PWM signal Spwm which has a waveform close to the PWM signal obtained through the NPWM modulation.

The coefficient $\beta$ in the aforementioned equation (8), found empirically, is adjusted and determined in consideration of the sampling frequency fs and the frequency band of the analog signal X(t) to obtain the PWM signal Spwm having a waveform close to the PWM signal obtained thought the NPWM modulation.

For example, the coefficient $\beta$ is preferably set at about $2\times10^{-7}$ when a sampling frequency is 768 kHz after a PCM data train entered has been oversampled and the signal frequency is 10 kHz.

In the foregoing, the principle of the interpolation processing according to this embodiment and the principle of generating the PWM signal Spwm have been explained. Now, the validity such as of the interpolation principle will be explained below.

The considerations which were given by the inventor to develop the PWM modulator 1 according to this embodiment will be described to explain the validity such as of the interpolation principle.

First, suppose that the LPWM modulation described in connection with the prior art is employed to determine the coordinates (tpa, Xp) at which a straight line S(t) connecting between the two sample values $X_1$ and $X_2$ shown in FIGS. 2C and 2D intersects the reference signal R(t), as well as the coordinates (tpb, Xp) at which a straight line S(t) connecting between the two sample values $X_1$ and $X_2$ shown in FIGS. 3C and 3D intersects the reference signal R(t). In this case, as can be seen from FIGS. 2C, 2D, 3C, and 3D, the value Xp tends to approach the sample value $X_1$ as the sample values $X_1$ and $X_2$ take on negative values, whereas the value Xp tends to approach the sample value $X_2$ as the sample values $X_1$ and $X_2$ take on positive values.

Accordingly, the first consideration was given to a weighting factor W which was expressed by the following equation (9) and increased as the sample values $X_1$ and $X_2$ took on positive values. Then, the weighting factor W was applied to the following equation (10) to thereby approximate the coordinates (tp, Xp) as those in the LPWM modulation.

$$W=0.25(X_1+X_2)+0.5 \tag{9}$$

$$Xp=(1-W)X_1+W \cdot X_2 \tag{10}$$

However, since no consideration was given by this weighting factor W to whether the sample values $X_1$ and $X_2$ are greater or smaller than the other, such a weighting factor W was determined which could be applied even when the sample values $X_1$ and $X_2$ were differently greater or smaller than the other.

First, as a result of the comparison between FIGS. 2C and 3C, attention was focused on the fact that when the sample values $X_1$ and $X_2$ were positive, the point in time tpa at the aforementioned coordinates determined when $X_1<X_2$ as shown in FIG. 2C and the point in time tpb at the aforementioned coordinates determined when $X_1>X_2$ as shown in FIG. 3C were related to each other such that tpb<tpa.

On the other hand, as a result of the comparison between FIGS. 2D and 3D, attention was focused on the fact that when the sample values $X_1$ and $X_2$ were negative, the point in time tpa at the aforementioned coordinates determined when $X_1<X_2$ as shown in FIG. 2D and the point in time tpb at the aforementioned coordinates determined when $X_1>X_2$ as shown in FIG. 3D were related to each other such that tpb>tpa.

In this context, the following equation (11) was developed to determine a weighting factor W which reflected these facts.

$$W=\{1+\alpha(X_2-X_1)\}\{0.25(X_1+X_2)\}+0.5 \tag{11}$$

It was then found that the weighting factor W determined by the equation (11) coincided at high accuracy with the point in time tp of the equation (3).

Furthermore, the value Xp determined by substituting the weighting factor into the equation (10) agreed at high accuracy with the value Xp determined by the equation (4).

Therefore, without a division operation requiring many computation steps, it is possible to determine the coordinates (tp, Xp) of the point at which the straight line S(t) connecting between $X_1$ and $X_2$ intersects the reference signal R(t) and thus perform the PWM modulation approximating the NPWM modulation with fewer computation steps.

However, the aforementioned intersection coordinates (tp, Xp) still fall out of the intersection coordinates (tc, Xc) of the analog signal X(t) and the reference signal R(t). Thus, it is still not possible only by substituting the weighting factor W determined by the equation (11) into the equation (10) to produce a PWM signal approximating the NPWM modulation with sufficiently high accuracy.

For this reason, the equations (7) and (8) mentioned above were developed to make the intersection coordinates (tp, Xp) closer to (tc, Xc).

That is, the correction factor d determined by the aforementioned equation (7) represents the value of difference between the arithmetic average value ($0.5(X_0+X_2)$) of the sample values $X_0$ and $X_2$ shown in FIG. 4A and the sample value $X_1$, while also representing the difference between the arithmetic average value ($0.5(X_0+X_2)$) and the original analog signal X(t).

That is, the correction factor d serves as an index showing the fact that a correction factor d having a positive value indicates that the amplitude of the original analog signal X(t) to tend to change in a convex shape within a sampling period To, whereas a correction factor d having a negative value indicates that the amplitude of the original analog signal X(t) to tend to change in a concave shape within a sampling period To.

Accordingly, increasing the sample value Xp for the correction factor d having a positive value makes the value Xp closer to the value Xc at the coordinates (tc, Xc), whereas decreasing the value Xp for the correction factor d having a negative value makes the value Xp closer to the value Xc at the coordinates (tc, Xc).

As shown in an enlarged view in FIG. 4B, the aforementioned sample value Xp is obtained by the aforementioned equation (10) is equivalent to the sample value at the point in time tp at which a straight line "Line" connecting between the two coordinates, i.e., the coordinates (0, $X_1$) indicated by the point in time t=0 and the sample value $X_1$ and the coordinates (1, $X_2$) indicated by the point in time t=1 and the sample value $X_2$, intersects the reference signal R(t). The sample value Xp can be corrected so as to increase or decrease in response to the value of the correction factor d, thereby making it possible to determine a sample value Xq closer to the amplitude value of the analog signal X(t) at the point in time tp.

In this context, to perform such correction processing, the aforementioned equation (8) was developed to determine an interpolated sample value Xq.

The $(X_1-Xp)(Xp-X_2)$ appearing in the second term on the right hand side of the aforementioned equation (8) serves to reduce the amount of correction when the sample value Xp is close to the sample value $X_1$ or $X_2$. It is therefore possible by computing this term to prevent a problem that the sample value Xq falls significantly out of the sample value $X_1$ or $X_2$ when the sample value Xp is close to the sample value $X_1$ or $X_2$.

The point in time tq was determined at which the reference signal R(t) had a value OPT equal to the sample value Xq, and located in time extremely close to the aforementioned point in time tc.

Figure 4:
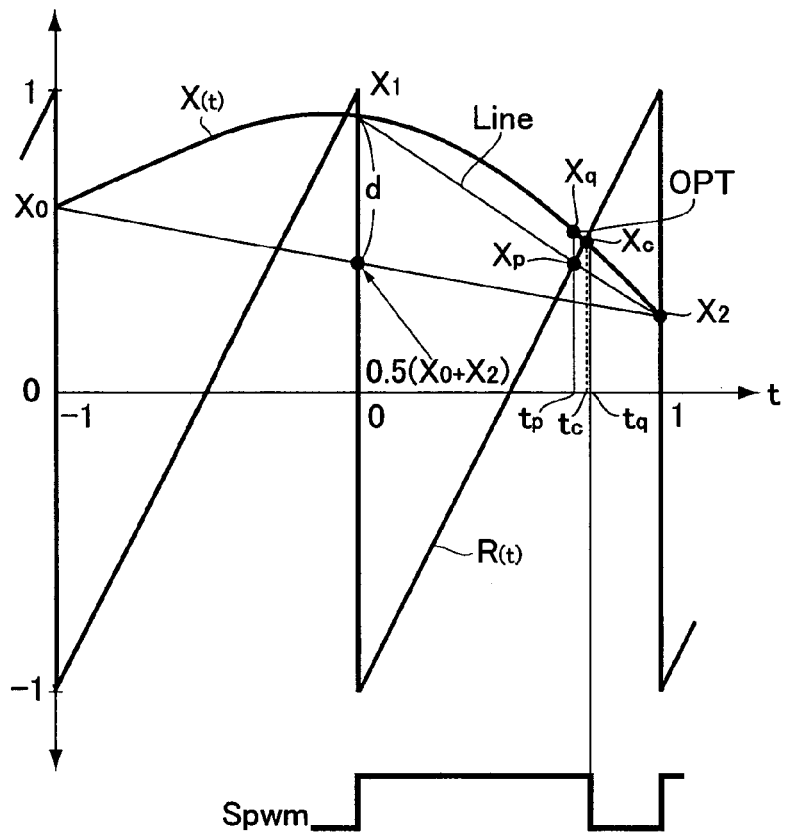
FIGS. 4A and 4B are still further explanatory views showing the interpolation processing and the operation of generating an interpolation signal by the pulse width modulator shown in FIG. 1.
Figure 4:
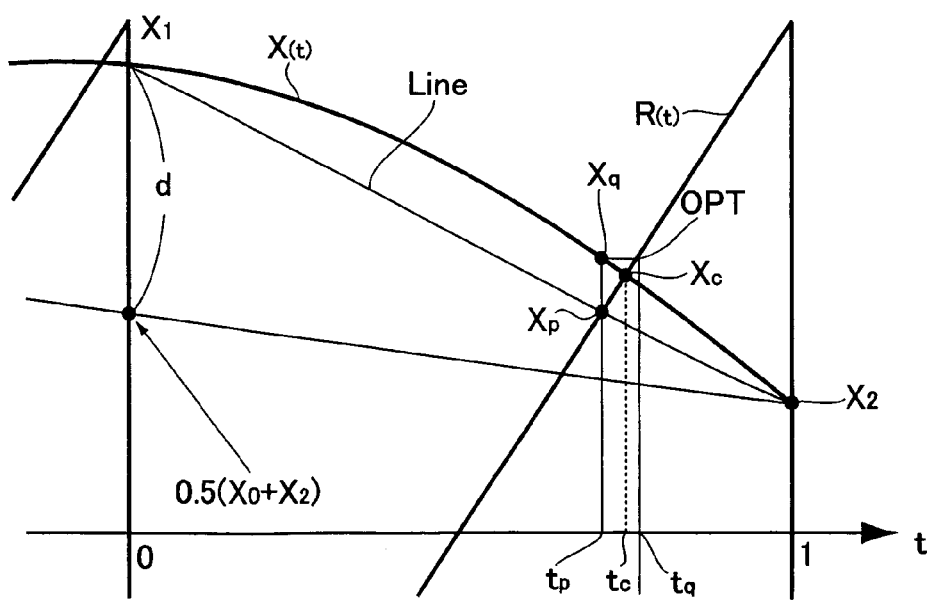
Figure 5:
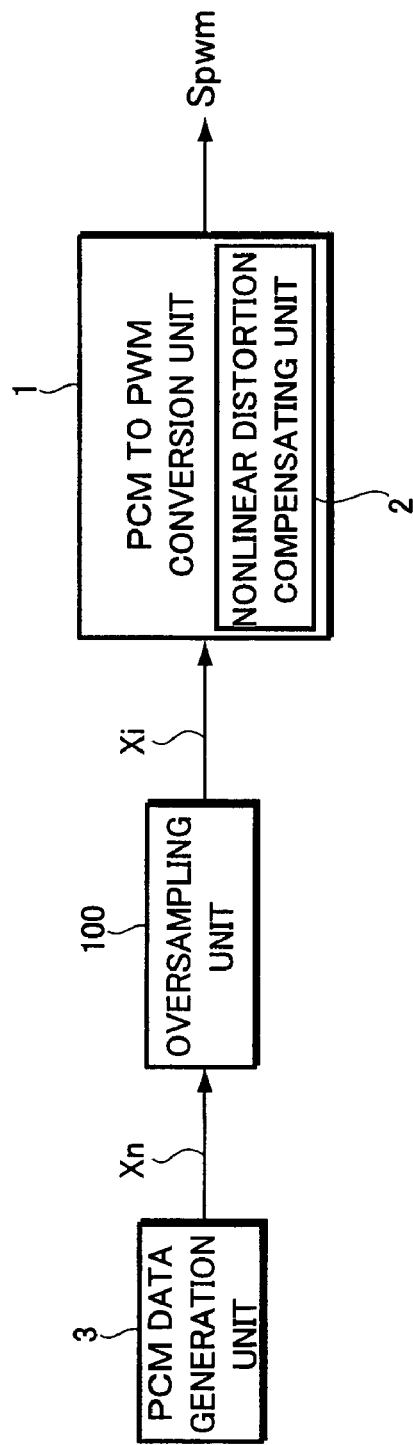
FIGS. 5A and 5B are block diagrams showing the configuration of a pulse width modulator according to a second embodiment of the invention.
Figure 5:
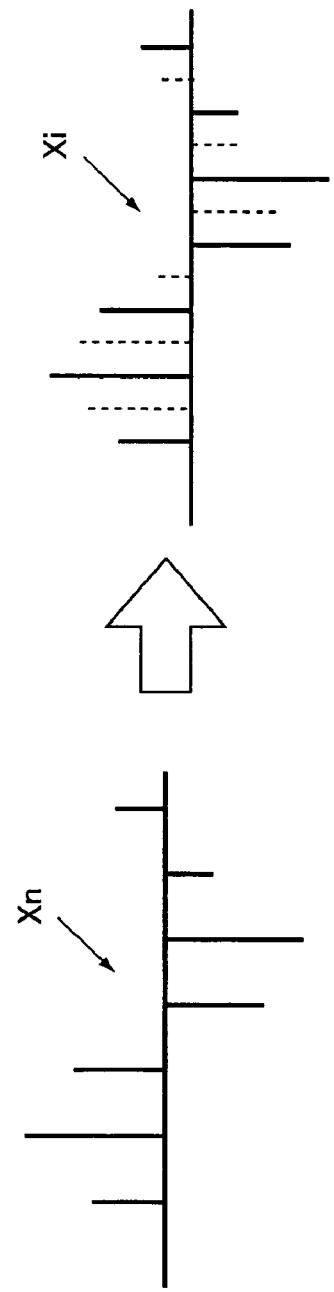
Figure 6:
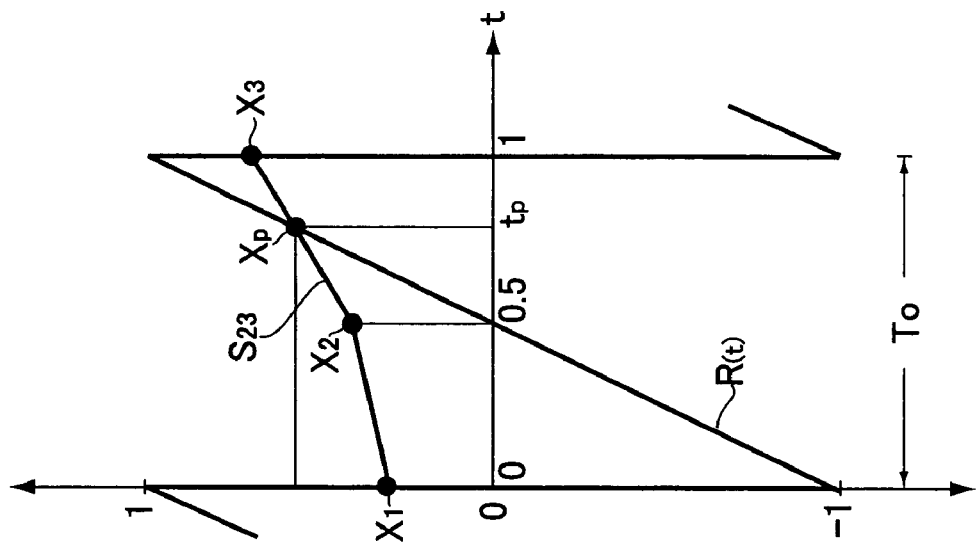
FIGS. 6A and 6B are explanatory views showing the interpolation processing and the operation of generating an interpolation signal by the pulse width modulator shown in FIG. 5.
Figure 6:
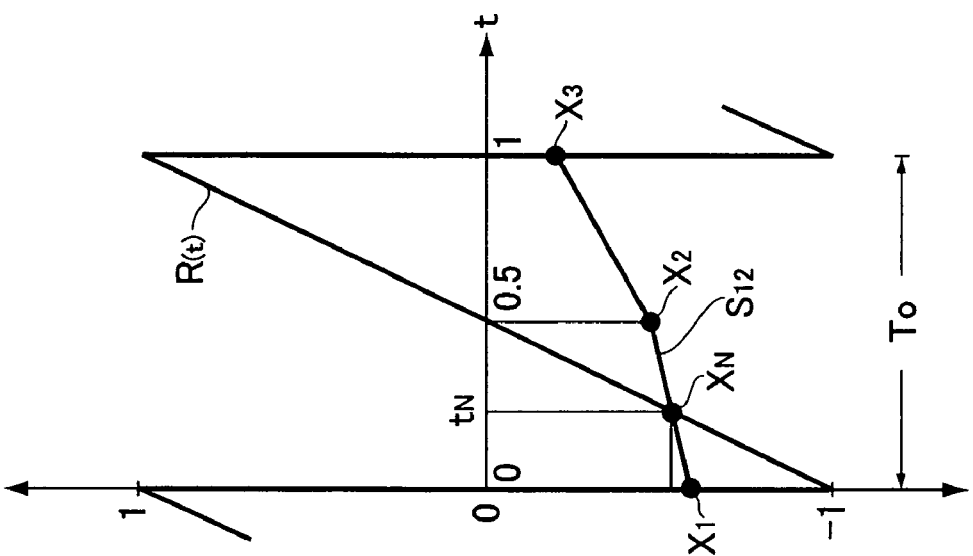
Figure 7:
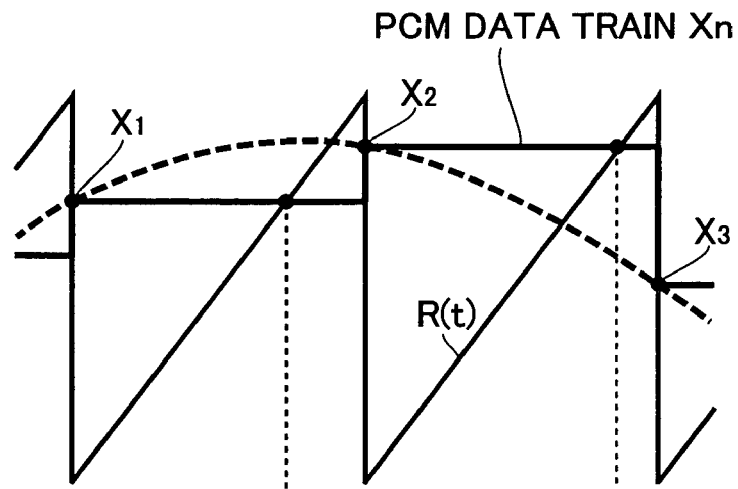
FIGS. 7A to 7C are explanatory views showing a problem of a prior art pulse width modulation method.
Figure 7:
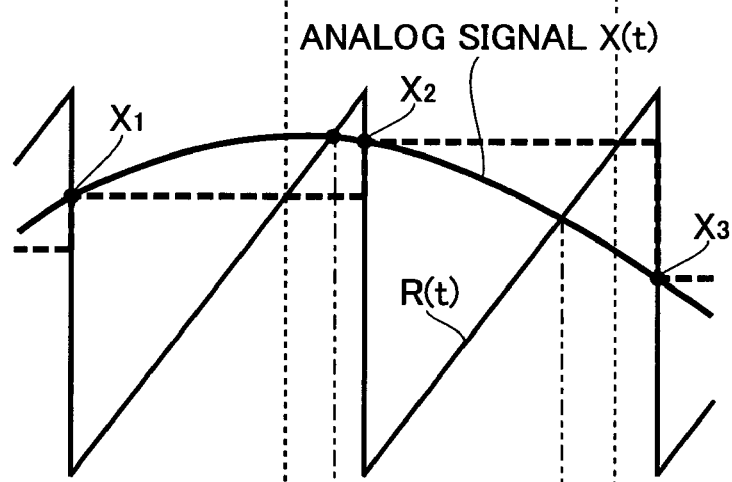
Figure 7:
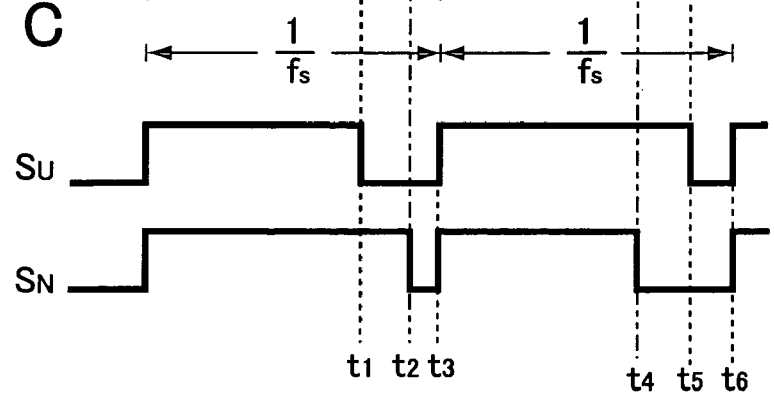
Figure 8:
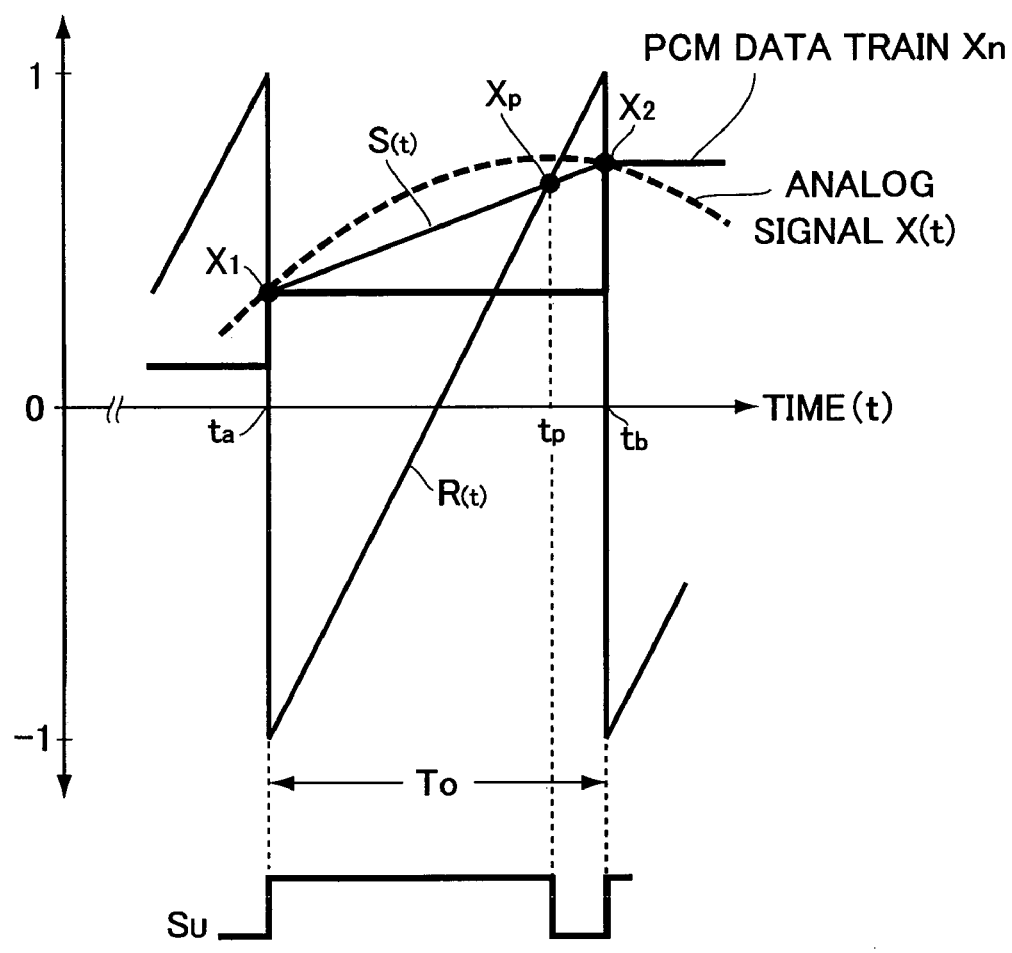
FIG. 8 is an explanatory view showing a problem of a prior art interpolation method.

As shown in FIG. 4, a square wave signal was then produced which was inverted to the logic "H" at the start point in time of the sampling period To and inverted to the logic "L" at the point in time tq, and defined as an interpolated PWM signal Spwm.

As described above, according to the pulse width modulator 1 of this embodiment, the computational processing shown by the aforementioned equations (5) to (8) can be performed. This allows a sample value Xq to be obtained which is very close to the amplitude value provided at the point in time at which the original analog signal X(t) that generates the PCM data train Xn intersects the reference signal R(t). The point in time tq is also determined at which the reference signal R(t) has the amplitude equal to the sample value Xq, thereby providing a point in time tq extremely close to the point in time tc obtained through the NPWM modulation.

For this reason, by inverting the logic state of the PWM signal Spwm from "H" to "L" at the point in time tq, it was possible to produce a PWM signal Spwm extremely close to the PWM signal obtained through the NPWM modulation, thereby implementing the PWM modulator capable of reducing nonlinear distortion.

Furthermore, since no division operation is required in the interpolation processing according to this embodiment, it is possible to significantly reduce the number of computation steps, thereby making it possible to provide, for example, an effect of implementing high-speed digital signal processing.

The computational equation (8) for determining the aforementioned interpolated sample value Xq was geometrically determined using the sample values $X_1$ and $X_2$ of the PCM data train Xn and the correction factor d. However, as a modified example of this embodiment, the aforementioned sample value Xq may also be determined in accordance with the following equation (12) which is determined by applying the Lagrangian method.

$$Xq = 0.5 \cdot X_0(W^2 - W) + X_1(1 - W^2) + 0.5 \cdot X_2(W^2 + W)$$

That is, in this modified example, the computational processing expressed by the aforementioned equation (5) is performed to determine the weighting factor W, and thereafter, in place of performing the computational processing of the aforementioned equations (6) to (8), the weighting factor W and the three successive sample values $X_0$, $X_1$, and $X_2$ are applied to the aforementioned equation (12) to determine an interpolated sample value Xq.

Then, in the same manner as shown in FIGS. 4A to 4B, the point in time tq is determined at which the reference signal R(t) equals the sample value Xq to produce the PWM signal Spwm, the logical state of which is inverted at the point in time tq.

Second Embodiment

Now, a second embodiment of the present invention will be explained below with reference to FIGS. 5A to 6B.

This embodiment relates to a pulse width modulator for producing a PWM modulation signal from an oversampled PCM data train.

FIG. 5A is a view showing the configuration of the pulse width modulator, with the same parts as or the parts corresponding to those of FIG. 1 being indicated by the same symbols.

Referring to FIG. 5A, this embodiment is different from the first embodiment as follows. That is, a PCM data train Xn of a sampling frequency fs outputted from the PCM data generation unit 3 is oversampled by an oversampling unit 100 at a sampling frequency fov twice as high as the sampling frequency fs, and the pulse width modulator 1 produces and outputs a PWM signal Spwm synchronous with the sampling frequency fs in accordance with the oversampled PCM data train Xn.

In other words, as shown in FIG. 5B, when a PCM data train Xn of a certain sampling frequency fs is entered, the oversampling unit 100 inserts data having a sample value set at zero in accordance with the aforementioned sampling frequency fov in between each piece of data and then performs filtering thereon with a digital low pass filter (not shown), thereby outputting an oversampled PCM data train Xi.

Then, the pulse width modulator 1 interpolates the oversampled PCM data train Xi, thereby producing and outputting a PWM signal Spwm synchronous with the sampling frequency fs, the PWM signal Spwm approximating the PWM signal obtained through the NPWM modulation.

The interpolation processing of the pulse width modulator 1 and the operation of generating the PWM modulation signal are explained with reference to FIGS. 6A and 6B. The PCM data train Xi is oversampled at a sampling frequency fov twice as high as the sampling frequency fs.

Referring to FIGS. 6A and 6B, the pulse width modulator 1 internally generates a sawtooth wave reference signal R(t) for the oversampled PCM data train Xi in sync with a sampling period To corresponding to the inverse of the sampling frequency fs.

The pulse width modulator 1 also normalizes each sample value of the PCM data train Xi within the range of $\pm 1$ and defines the sampling period To as a unit time width with its start point in time t=0, end point in time t=1, and middle point in time t=0.5 between the start point in time and the end point in time, in order to perform interpolation processing or the like.

Furthermore, the pulse width modulator 1 performs the interpolation processing using a total of three sample values $X_1$, $X_2$, and $X_3$, i.e., the sample value $X_2$ obtained at the middle point in time (t=0.5) and the sample values $X_1$ and $X_3$ before and after the sample value $X_2$.

Furthermore, the pulse width modulator 1 detects whether the sample value $X_2$ obtained at the aforementioned middle point in time (t=0.5) is positive or negative, and then performs the interpolation processing in a different way in accordance with the result of the detection to produce the PWM signal Spwm.

As shown in FIG. 6A, if the sample value $X_2$ is negative, the computational processing expressed by the following equation (13) is performed using two sample values $X_1$ and $X_2$ of the three successive sample values $X_1$, $X_2$ and $X_3$ to determine an appropriate weighting factor $W_N$.

$$W_N = \{1 + \gamma(X_2 - X_1)\}\{0.5(X_1 + X_2) + 0.5\} + 0.5 \tag{13}$$

Furthermore, the computational processing expressed by the following equation (14) is performed using the weighting factor $W_N$ and the two sample values $X_1$ and $X_2$ to estimate a sample value $X_N$.

$$X_N = (1 - W_N)X_1 + W_N X_2 \tag{14}$$

That is, such interpolation processing is performed to determine the sample value $X_N$ at which a straight line connecting between the sample values $X_1$ and $X_2$ shown in FIG. 6A, i.e., a straight line $S_{12}$ corresponding to a linear approximation of an analog signal intersects the reference signal R(t).

Then, determined is the point in time $t_N$ of the reference signal R(t) corresponding to the sample value $X_N$. That is, the coordinates ($t_N$, $X_N$) at which the aforementioned straight line $S_{12}$ intersects the reference signal R(t) are determined.

Then, the PWM signal Spwm is produced and outputted which is inverted to the logic "H" at the point in time t=0, to the logic "L" at the point in time $t_N$, and to the logic "H" at the point in time t=1.

On the other hand, as shown in FIG. 6B, if the sample value $X_2$ is positive, the computational processing expressed by the following equation (15) is performed using two sample values $X_2$ and $X_3$ of the three successive sample values $X_1$, $X_2$, and $X_3$ to determine a weighting factor Wp.

$$Wp = \{1 + \gamma(X_3 - X_2)\}\{0.5(X_2 + X_3) - 0.5\} + 0.5 \tag{15}$$

Furthermore, the computational processing expressed by the following equation (16) is performed using the weighting factor Wp and the two sample values $X_2$ and $X_3$ to estimate a sample value Xp.

$$Xp = (1 - Wp)X_2 + Wp X_3 \tag{16}$$

That is, such interpolation processing is performed to determine the sample value Xp at which a straight line connecting between the sample values $X_2$ and $X_3$ shown in FIG. 6B, i.e., a straight line $S_{23}$ corresponding to a linear approximation of an analog signal intersects the reference signal R(t).

Then, determined is the point in time tp of the reference signal R(t) corresponding to the sample value Xp. That is, the coordinates (tp, Xp) at which the aforementioned straight line $S_{23}$ intersects the reference signal R(t) are determined.

Then, the PWM signal Spwm is produced and outputted which is inverted to the logic "H" at the point in time t=0, to the logic "L" at the point in time tp, and to the logic "H" at the point in time t=1.

As described above, this embodiment makes it possible to generate the PWM signal Spwm in accordance with an oversampled PCM data train Xi.

Furthermore, since the linear interpolation is performed using three successive sample values $X_1$, $X_2$, and $X_3$, it is possible to produce a PWM signal Spwm which is very close to the PWM signal obtained by the NPWM modulation and has reduced nonlinear distortion.

Furthermore, since no division operation is required for the interpolation processing, it is possible to reduce the number of computation steps, thereby making it possible to implement high-speed digital signal processing.

The coefficient γ in the aforementioned equations (13) and (15) is provided to make fine adjustments of the weighting factors $W_N$ and Wp and may be preferably set at a value on the order of 1.0.

As described above, upon producing a pulse width modulation signal from a pulse code modulated data train, the present invention makes it possible to perform computational interpolation processing without division operations, thereby significantly reducing the number of computation steps.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A pulse width modulator for converting a pulse code modulated data train to produce a pulse width modulation signal, comprising:
   a first unit for calculating, from a first sample value and a second sample value adjacent to each other in said pulse code modulated data train, a weighting factor W taking on a larger value as said first sample value and said second sample value take on large positive values;
   a second unit for interpolating said first sample value and said second sample value with said weighting factor to determine a linearly interpolated value; and
   a third unit for producing a pulse width modulation signal in accordance with said linearly interpolated value, wherein
   said second unit determines said linearly interpolated value Xp through following computational processing, $Xp=(1-W)X_1+W\cdot_2$ in accordance with said first sample value $X_1$, said second sample value $X_2$, and said weighting factor W.

2. The pulse width modulator according to claim 1, wherein
   said first unit determines said weighting factor W through following computational processing, $W=\{1+\alpha(X_2-X_1)\}\{0.25(X_1+X_2)\}+0.5$ in accordance with said first sample value $X_1$, said second sample value $X_2$, and an appropriate coefficient α.

3. A pulse width modulator for converting a pulse code modulated data train to produce a pulse width modulation signal comprising:
   a first unit for calculating, from a first sample value and a second sample value adjacent to each other in said pulse code modulated data train, a weighting factor W taking on a larger value as said first sample value and said second sample value take on large positive values;
   a second unit for interpolating said first sample value and said second sample value with said weighting factor to determine a linearly interpolated value;
   a third unit for determining a difference d between said first sample value and an arithmetic average value of a sample value $X_0$ provided one sampling period before said first sample value and said second sample value;
   a fourth unit for determining an interpolated sample value in accordance with said linearly interpolated value, said first sample value, said second sample value, and said difference; and
   a fifth unit for producing a pulse width modulation signal in accordance with said interpolated sample values,
   wherein
   said third unit determines said difference d through following computational processing $d=X_1-0.5(X_0+X_2)$ in accordance with said first sample value $X_1$ said second sample value $X_2$ and said sample value $X_0$ provided one sampling period before said first sample value $X_1$.

4. The pulse width modulator according to claim 3, wherein
   said fourth unit determines said interpolated sample value Xq through following computational processing $Xq=Xp+\beta\cdot d(X_1-Xp)(Xp-X_2)$ in accordance with said first sample value $X_1$, said second sample value $X_2$, said difference d, said linearly interpolated value Xp, and an appropriate coefficient β.

5. A pulse width modulator for converting a pulse code modulated data train to produce a pulse width modulation signal comprising:
   a first unit for calculating, from a first sample value $X_1$ and a second sample value $X_2$ adjacent to each other in said pulse code modulated data train, a weighting factor W taking on a larger value as said first sample value $X_1$ and said second sample value $X_2$ take on positive values;
   a second unit for determining an interpolated sample value Xq through following computational processing $Xq=0.5\cdot X_0(W^2-W)+X_1(1-W^2)+0.5\cdot X_2(W^2+W)$ in accordance with a sample value $X_0$ provided one sampling period before said first sample value $X_1$, said first sample value $X_1$, said second sample value $X_2$, and said weighting factor W; and
   a third unit for producing a pulse width modulation signal in accordance with said interpolated sample value Xq.

6. A pulse width modulator for converting a pulse code modulated data train oversampled at a sampling frequency twice as high as a predetermined sampling frequency to produce a pulse width modulation signal, comprising a first unit for determining, if a sample value $X_2$ inserted into said pulse code modulated data train by said oversampling is negative, a first weighting factor $W_N$ through following computational processing $$W_N=\{1+\gamma(X_2-X_1)\}\{0.5(X_1+X_2)+0.5\}+0.5$$

in accordance with said sample value $X_2$, a sample value $X_1$ previously adjacent to said sample value $X_2$, and an appropriate coefficient $\gamma$, as well as a first interpolated sample value $X_N$ through following computational processing $$X_N=(1-W_N)X_1+W_N X_2$$

in accordance with said first weighting factor $W_N$, said sample value $X_2$, and said previously adjacent sample value $X_1$, said first unit for further determining, if the sample value $X_2$ inserted into said pulse code modulated data train by said oversampling is positive, a second weighting factor Wp through following computational processing $$Wp=\{1+\gamma(X_3-X_2)\}\{0.5(X_2+X_3)-0.5\}+0.5$$

in accordance with said sample value $X_2$, a sample value $X_3$ subsequently adjacent to said sample value $X_2$, and an appropriate coefficient $\gamma$, as well as a second interpolated sample value Xp through following computational processing $$Xp=(1-Wp)X_2+Wp X_3$$

in accordance with said second weighting factor Wp, said sample value $X_2$, and said subsequently adjacent sample value $X_3$; and a second unit for producing a pulse width modulation signal in accordance with said first sample value $X_N$ if said inserted sample value $X_2$ is negative and in accordance with said second sample value Xp if said inserted sample value $X_2$ is positive.

7. A pulse width modulation method for converting a pulse code modulated data train to produce a pulse width modulation signal, comprising:

a first step of calculating, from a first sample value and a second sample value adjacent to each other in said pulse code modulated data train, a weighting factor taking on a larger value as said first sample value and said second sample value take on large positive values;

a second step of interpolating said first sample value and said second sample value with said weighting factor to determine a linearly interpolated value; and a third step of producing a pulse width modulation signal in accordance with said linearly interpolated value, wherein said second unit determines said linearly interpolated value Xp through following computational processing, $$Xp=(1-W)X_1+W\cdot X_2$$

in accordance with said first sample value $X_1$, said second sample value $X_2$, and said weighting factor W.

8. A pulse width modulation method for converting a pulse code modulated data train to produce a pulse width modulation signal, comprising:

a first step of calculating, from a first sample value and a second sample value adjacent to each other in said pulse code modulated data train, a weighting factor taking on a larger value as said first sample value and said second sample value take on large positive values;

a second step of interpolating said first sample value and said second sample value with said weighting factor to determine a linearly interpolated value;

a third step of determining a difference between said first sample value and an arithmetic average value of a sample value provided one sampling period before said first sample value and said second sample value;

a fourth step of determining an interpolated sample value in accordance with said linearly interpolated value, said first sample value, said second sample value, and said difference; and a fifth step of producing a pulse width modulation signal in accordance with said interpolated sample value, wherein said third unit determines said difference d through following computational processing $$d=X_1-0.5(X_0+X_2)$$

in accordance with said first sample value $X_1$, said second sample value $X_2$, and said sample value $X_0$ provided one sampling period before said first sample value $X_1$.

9. A pulse width modulation method for converting a pulse code modulated data train to produce a pulse width modulation signal, comprising:

a first step of calculating, from a first sample value $X_1$ and a second sample value $X_2$ adjacent to each other in said pulse code modulated data train, a weighting factor W taking on a larger value as said first sample value $X_1$ and said second sample value $X_2$ take on large positive values, a second step of determining an interpolated sample value Xq through following computational processing $$Xq=0.5\cdot X_0(W^2-W)+X_1(1-W^2)+0.5\cdot X_2(W^2+W)$$

in accordance with a sample value $X_0$ provided one sampling period before said first sample value $X_1$, said first sample value $X_1$, said second sample value $X_2$, and said weighting factor W; and a third step of producing a pulse width modulation signal in accordance with said interpolated sample value Xq.

10. A pulse width modulation method for converting a pulse code modulated data train oversampled at a sampling frequency twice as high as a predetermined sampling frequency to produce a pulse width modulation signal, comprising a first step including the substeps of determining, if a sample value $X_2$ inserted into said pulse code modulated data train by said oversampling is negative, a first weighting factor $W_N$ through following computational processing $$W_N=\{1+\gamma(X_2-X_1)\}\{0.5(X_1+X_2)+0.5\}+0.5$$

in accordance with said sample value $X_2$, a sample value $X_1$ previously adjacent to said sample value $X_2$, and an appropriate coefficient $\gamma$, as well as a first interpolated sample value $X_N$ through following computational processing $$X_N=(1-W_N)X_1+W_N X_2$$

in accordance with said first weighting factor $W_N$, said sample value $X_2$, and said previously adjacent sample value $X_1$ said first step further including the substeps of determining, if the sample value $X_2$ inserted into said pulse code modulated data train by said oversampling is positive, a second weighting factor Wp through following computational processing $$Wp=\{1+\gamma(X_3-X_2)\}\{0.5(X_2+X_3)-0.5\}+0.5$$

in accordance with said sample value $X_2$, a sample value $X_3$ subsequently adjacent to said sample value $X_2$, and an appropriate coefficient $\gamma$, as well as a second interpolated sample value Xp through following computational processing $$Xp=(1-Wp)X_2+WpX_3$$

in accordance with said second weighting factor Wp, said sample value $X_2$, and said subsequently adjacent sample value $X_3$; and a second step of producing a pulse width modulation signal in accordance with said first sample value XN if said inserted sample value $X_2$ is negative and in accordance with said second sample value Xp if said inserted sample value $X_2$ is positive.

* * * * *